(12) United States Patent
Khalil et al.

(10) Patent No.: US 7,961,498 B2
(45) Date of Patent: Jun. 14, 2011

(54) LEAKAGE COMPENSATION CIRCUIT FOR DYNAMIC RANDOM ACCESS MEMORY (DRAM) CELLS

(75) Inventors: DiaaEldin S. Khalil, Portland, OR (US); Arijit Raychowdhury, Hillsboro, OR (US); Muhammad M. Khellah, Tigard, OR (US); Ali Keshavarzi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 242 days.

(21) Appl. No.: 12/236,302

(22) Filed: Sep. 23, 2008

(65) Prior Publication Data

US 2010/0073994 A1 Mar. 25, 2010

(51) Int. Cl.
*G11C 11/24* (2006.01)

(52) U.S. Cl. ........ 365/149; 365/174; 365/104; 365/208; 365/226; 365/204

(58) Field of Classification Search .................. 365/149, 365/174, 104, 208, 226, 72, 204
See application file for complete search history.

(56) References Cited

U.S. PATENT DOCUMENTS

| | | |
|---|---|---|
| 7,800,400 B2 | 9/2010 | Rahim et al. |
| 2005/0285634 A1* | 12/2005 | Doyle et al. ............ 327/72 |

OTHER PUBLICATIONS

Wing K. Luk, "A 3-Transistor DRAM Cell with Gated Diode for Enhanced Speed and Retention Time", IBM Thomas J. Watson Research Center, Yorktown Heights, NY 10598, IEEE 2006, pp. 1-2.

\* cited by examiner

*Primary Examiner* — Thong Q Le
(74) *Attorney, Agent, or Firm* — Blakely, Sokoloff, Taylor & Zafman LLP

(57) ABSTRACT

A Dynamic Random Access Memory (DRAM) cell comprising a leakage compensation circuit. The leakage compensation circuit allows a compensation current from a source to flow to the memory cell storage node of the DRAM cell to compensate the leakage current from the memory cell storage node of the DRAM cell to improve retention time.

23 Claims, 3 Drawing Sheets

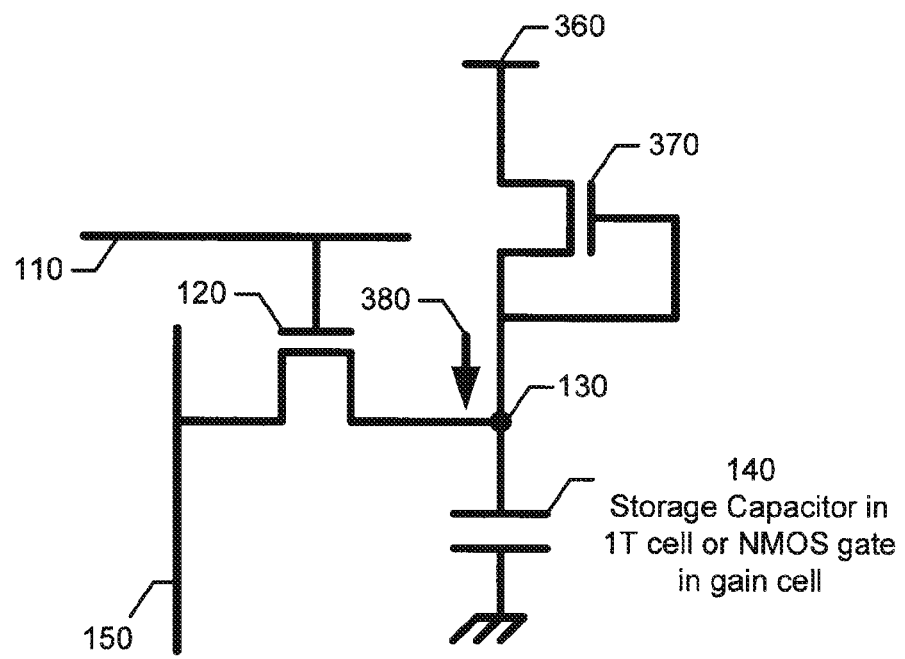
300          FIG. 3
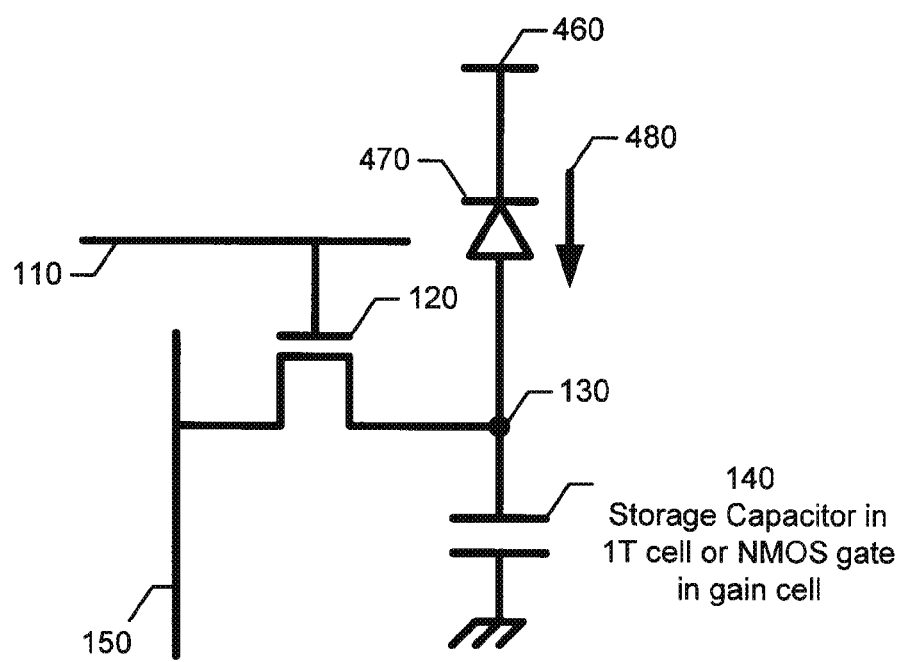
400          FIG. 4

LEAKAGE COMPENSATION CIRCUIT FOR DYNAMIC RANDOM ACCESS MEMORY (DRAM) CELLS

FIELD OF THE INVENTION

This invention relates to a leakage compensation circuit, and more specifically but not exclusively, to a leakage compensation circuit for dynamic random access memory cells.

BACKGROUND DESCRIPTION

Dynamic Random Access Memory (DRAM) has been considered as an alternative to Static Random Access Memory (SRAM) in embedded memories operating at low power supply conditions. This is because DRAM has several advantages over SRAM as it requires lesser chip area and it does not experience memory contention and read or write instabilities which limit the minimum power supply voltage ($V_{min}$) at which the DRAM can operate correctly.

However, memory charge retention is becoming increasingly important in embedded DRAM with the improvement of transistor technology. The feature size of transistors is shrinking and the scaling effect of the transistors reduces the capacitance of the memory cell storage node of the DRAM cell. The reduced capacitance, coupled with the higher leakage of the transistor in the DRAM cell as transistor technology improves, affects the memory charge retention of the DRAM cell.

When memory charge retention of the DRAM cell is reduced, more refresh cycles are needed to maintain the charge in the memory cell storage node. Refresh cycles are considered wasted time that impact performance and DRAM cells are recharged more often as transistor technology improves. The prior art typically attempts to solve the memory charge retention problem of DRAM cells by increasing the voltage of the memory cell storage nodes of the DRAM cells or by optimizing the fabrication process to reduce leakage and developing novel devices and capacitors, rather than relying on circuit techniques.

FIG. 1 shows a DRAM cell 100 where the gate node of the transistor 120 is connected to a word line 110 and the drain node of the transistor 120 is connected to a bit line 150. Element 140 is a storage capacitor in a 1 Transistor (1T) DRAM cell or the N-channel Metal Oxide Semiconductor (NMOS) gate in a gain cell. The memory cell storage node 130 of the DRAM cell 100 is connected to the storage capacitor or NMOS gate 140 that stores the charge or data. To minimize the memory charge retention problem in the DRAM cell 100, the commonly used solution is to increase the voltage of the memory cell storage node 130 by increasing the voltage of the word line 110. However, this solution may result in reliability issues as higher voltage is used. One circuit technique 200, as shown in FIG. 2, proposes a gated diode 260 to be added to a three transistors (3T) DRAM cell that acts as a storage device and amplifier.

BRIEF DESCRIPTION OF THE DRAWINGS

The features and advantages of embodiments of the invention will become apparent from the following detailed description of the subject matter in which:

FIG. 3 illustrates a circuit diagram of a leakage compensation circuit using an N-channel Metal Oxide Semiconductor (NMOS) field effect transistor (FET) in accordance with one embodiment of the invention;

FIG. 4 illustrates a circuit diagram of a leakage compensation circuit using a reverse biased junction in accordance with one embodiment of the invention.

DETAILED DESCRIPTION

Figure 1:
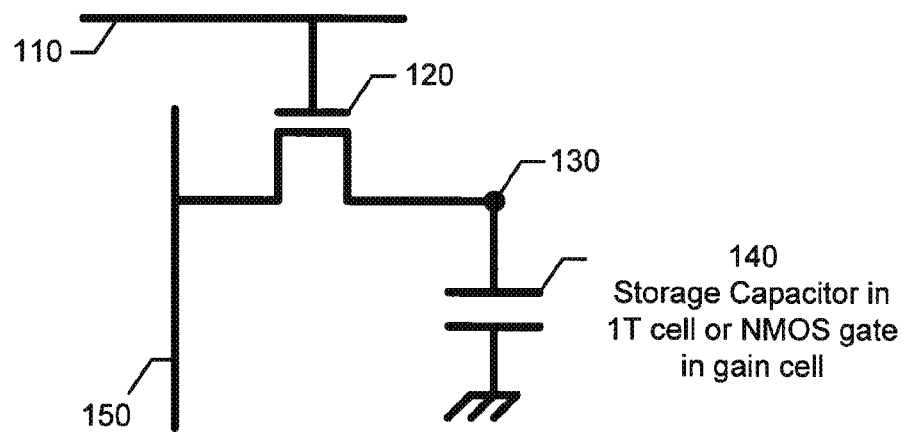
FIG. 1 illustrates a circuit diagram of a DRAM cell (prior art)
Figure 2:
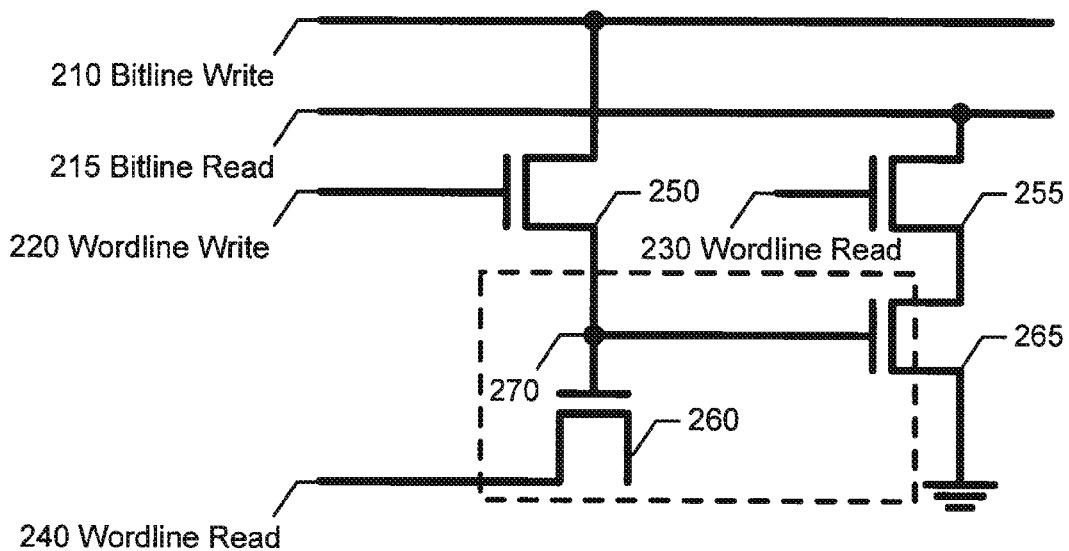
FIG. 2 illustrates a circuit diagram of a 3T DRAM cell with a gated diode (prior art)

Reference in the specification to "one embodiment" or "an embodiment" of the invention means that a particular feature, structure or characteristic described in connection with the embodiment is included in at least one embodiment of the invention. Thus, the appearances of the phrase "in one embodiment" appearing in various places throughout the specification are not necessarily all referring to the same embodiment.

Embodiments of the invention utilize a leakage compensation circuit to address the memory charge retention problem of a DRAM cell. The leakage compensation circuit allows a compensation current from a source to flow to the memory cell storage node of a DRAM cell to compensate the leakage current from the memory cell storage node of the DRAM cell. The source includes, but is not limited to, a power supply of the DRAM cell, a power supply separate from the power supply of the DRAM cell, or any other power source that is able to compensate the leakage current from the memory cell storage node. The source is not limited to a static power supply and can be analog calibrated voltages or time varying voltages.

FIG. 3 illustrates a circuit diagram of a leakage compensation circuit 300 using an N-channel Metal Oxide Semiconductor (NMOS) field effect transistor (FET) 370. The memory cell storage node 130 of the DRAM cell is connected to the gate node and source node of the NMOS transistor 370. The drain node of the NMOS transistor 370 is connected to a source 360. The leakage compensation current 380 includes the sub-threshold leakage current of the NMOS transistor 370 flowing from the source 360 to the memory cell storage node 130 and the gate tunneling leakage current of the NMOS transistor 370.

Leakage compensation circuit 300 is apt for a DRAM cell where the sub-threshold leakage current is dominant over other sources of leakage current. The other sources of leakage current include, but are not limited to, junction leakage of the NMOS transistors 120 and 370 from the memory cell storage node 130 to the ground node of the DRAM cell, and gate leakage of the NMOS transistor in place of the storage capacitor 140 if a gain cell is used.

The NMOS transistor 370 is selected in the leakage compensation circuit 300 because the transistor 120 is also an NMOS transistor. Since transistor 370 and transistor 120 are of the same type, there will be no significant increase of chip area to incorporate the leakage compensation circuit 300. Depending on the layout of the DRAM cell, it is also possible not to increase the area of the DRAM cell with the addition of the leakage compensation circuit 300.

FIG. 4 illustrates a leakage compensation circuit 400 using a reverse biased junction 470. The reverse biased junction 470 is formed using P-diffusion in an N-well. In another embodiment, the reverse biased junction 470 can be replaced by the drain node of a P-channel MOS (PMOS) transistor. A source 460 is connected to the cathode of the reverse biased junction 470 and the anode of the reverse biased junction 470 is connected to the memory cell storage node 130 of the DRAM cell. The junction leakage current 480 of the reverse biased junction 470 flows from the source 460 to the memory cell storage node 130.

The advantage of the leakage compensation circuit 400 is that the junction leakage current 480 can be adjusted to compensate the leakage current from the memory cell storage node 130. The junction leakage current 480 can be adjusted by modifying the size of the junction area of the reverse biased junction 470 or by modifying the parameters of the reverse biased junction. The leakage compensation circuit 400 may increase the chip area of the DRAM cell because of the spacing required between the N-well and the NMOS transistors.

Leakage compensation circuit 400 is apt for a DRAM cell where the junction leakage current is dominant over other sources of leakage current. The other sources of leakage current include, but are not limited to, sub-threshold leakage of the NMOS transistor 120 from the memory cell storage node 130 to the ground node of the DRAM cell, and gate leakage of the NMOS transistor in place of the capacitor 140 if a gain cell is used.

The leakage compensation circuits 300 and 400 enable a compensation current to flow from the sources 360 and 460 to the memory cell storage node 130 to compensate the leakage current from the memory cell storage node 130 of the DRAM cell. The selection of leakage compensation circuits 300 and 400 is done during the design phase of the DRAM cell. Based on the dominant type of leakage, the corresponding leakage compensation circuit is selected to improve the memory charge retention of the 1T DRAM cell.

By using the leakage compensation circuit 300 or 400 to compensate the leakage current from the memory cell storage node 130 to the ground node of the DRAM cell, memory charge retention is increased. The frequency of refresh cycles can be lowered and more valid work or operations can be done for a given period of time.

The leakage compensation currents 380 and 480 are small and do not affect the read and write operations of the DRAM cell. The leakage compensation currents 380 and 480 increase as the voltage on memory cell storage node 130 decreases. As such, when a logic zero is stored on the memory cell storage node 130, there is generally a flow of leakage current that may affect the voltage of logic zero of the memory cell storage node 130. Design considerations should balance the effect of improving the memory charge retention when storing a logic one and the effect of storing a logic zero. Bit line 150 is also pre-discharged in the DRAM cell of leakage compensation circuits 300 and 400 so that there is less leakage current from the transistor 120 to the memory cell storage node 130 when storing a logic zero.

Although leakage compensation circuits 300 and 400 are illustrated with a 1T DRAM cell, the workings of the invention is not limited to a 1T DRAM cell. The leakage compensation circuits 300 and 400 work on other DRAM memory cells including, but not limited to, 2T DRAM cells, 3T DRAM cells, or any other forms of dynamic memory cells with a charge storage node.

The sources 360 and 460 are not limited to a static power supply. The sources 360 and 460 can be analog calibrated voltages or time varying voltages. Different power supply waveforms can be used to compensate the leakage current from the memory cell storage node. In addition, to increase the junction leakage 480 in leakage compensation circuits 400, the voltage of the source 460 can be increased instead of increasing the size of the reversed biased junction 470.

As there is generally a continuous flow of compensation current from the source to compensate the leakage current from the memory cell storage node to the ground node, static power is dissipated continuously but less dynamic power is required to refresh the DRAM cells.

A plurality of the DRAM cells can be combined to form a larger DRAM module. For example, an embedded DRAM module of 4096 bytes (128 by 32 bytes) is formed by having 128 rows of 32 DRAM cells such as those described in FIG. 3 or FIG. 4. In one embodiment, the leakage compensation circuit 300 or 400 may be shared among groups of DRAM cells. For example, in one embodiment of the DRAM module, each pair of DRAM cells can share one leakage compensation circuit 300 by connecting the memory cell storage nodes of each pair of DRAM cells to the gate node and source node of the NMOS transistor 370. The pair of DRAM cells does not have to be limited to adjacent DRAM cells and can be non adjacent. Other combinations of connecting the leakage compensation circuits 300 or 400 to the DRAM cells may be used. In another embodiment, both leakage compensation circuits 300 and 400 are used in the same DRAM module.

Figure 5:
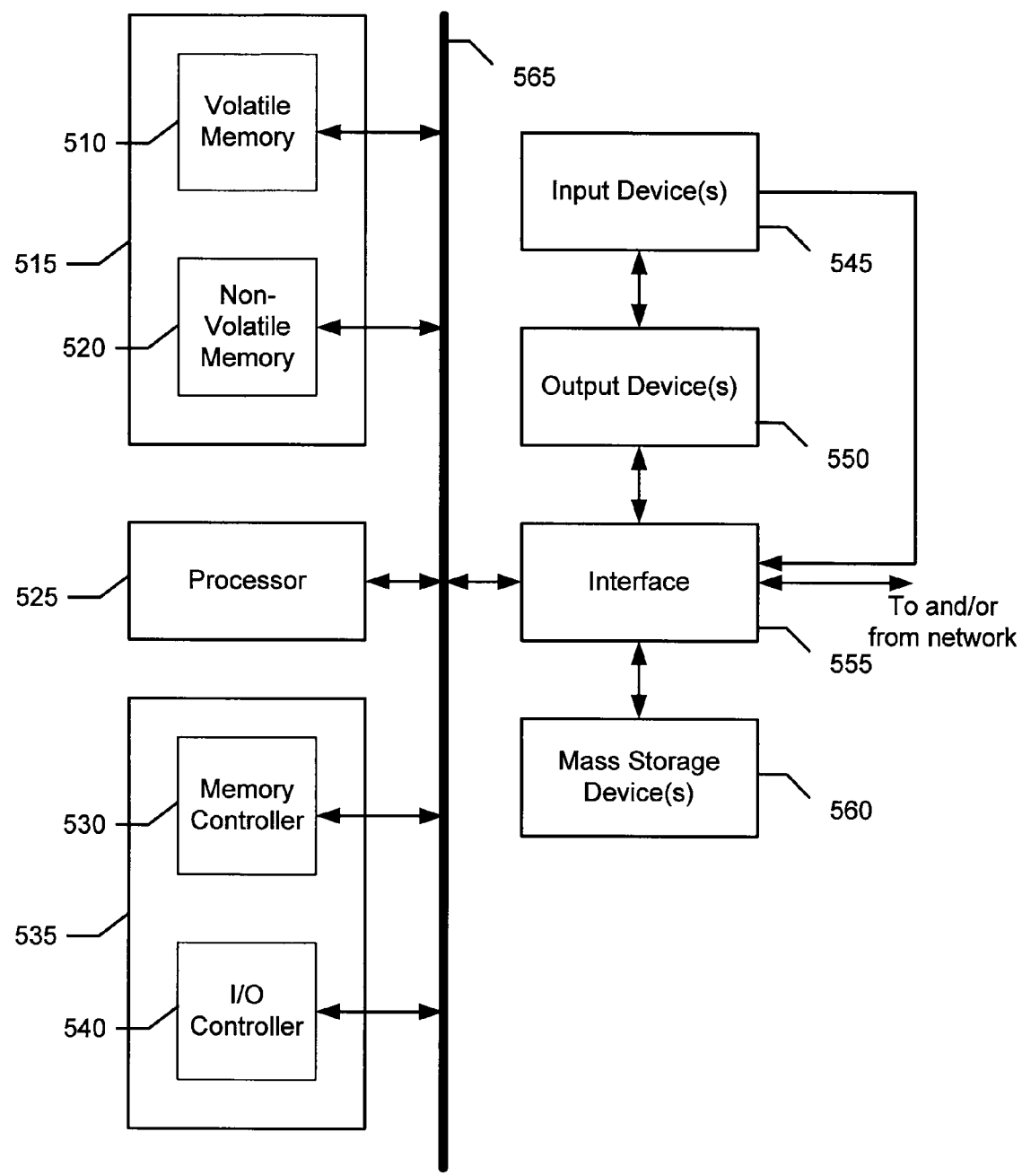
FIG. 5 illustrates a block diagram of a system in which the leakage compensation circuit according to an embodiment of the invention may be utilized.

FIG. 5 is a block diagram of a system 500 in which the leakage compensation circuit according to an embodiment of the invention may be utilized. The system 500 includes but is not limited to, a desktop computer, a laptop computer, a notebook computer, a personal digital assistant (PDA), a server, a workstation, a cellular telephone, a mobile computing device, an Internet appliance or any other type of computing device. In another embodiment, the system 500 may be a system on a chip (SOC) system.

The system 500 includes a chipset 535 with a memory controller 530 and an input/output (I/O) controller 540. A chipset typically provides memory and I/O management functions, as well as a plurality of general purpose and/or special purpose registers, timers, etc. that are accessible or used by a processor 525. The processor 525 may be implemented using one or more processors.

The memory controller 530 performs functions that enable the processor 525 to access and communicate with a main memory 515 that includes a volatile memory 510 and a non-volatile memory 520 via a bus 565. The volatile memory 510 includes but is not limited to, Synchronous Dynamic Random Access Memory (SDRAM), embedded DRAM with the leakage compensation circuit described earlier, RAMBUS Dynamic Random Access Memory (RDRAM), and/or any other type of random access memory device. The non-volatile memory 520 includes but is not limited to, flash memory, Read Only Memory (ROM), Electrically Erasable Programmable Read Only Memory (EEPROM), and/or any other desired type of memory device.

Memory 515 stores information and instructions to be executed by the processor 525. Memory 515 may also stores temporary variables or other intermediate information while the processor 525 is executing instructions.

The system 500 includes but is not limited to, an interface circuit 555 that is coupled with bus 565. The interface circuit 555 is implemented using any type of well known interface standard including, but is not limited to, an Ethernet interface, a universal serial bus (USB), a third generation input/output interface (3GIO) interface, and/or any other suitable type of interface.

One or more input devices 545 are connected to the interface circuit 555. The input device(s) 545 permit a user to enter data and commands into the processor 525. For example, the input device(s) 545 is implemented using but is not limited to, a keyboard, a mouse, a touch-sensitive display, a track pad, a track ball, and/or a voice recognition system.

One or more output devices 545 connect to the interface circuit 555. For example, the output device(s) 550 are implemented using but are not limited to, light emitting displays (LEDs), liquid crystal displays (LCDs), cathode ray tube (CRT) displays, printers and/or speakers). The interface circuit 555 includes a graphics driver card.

The system 500 also includes one or more mass storage devices 560 to store software and data. Examples of such mass storage device(s) 560 include but are not limited to, floppy disks and drives, hard disk drives, compact disks and drives, and digital versatile disks (DVD) and drives.

The interface circuit 555 includes a communication device such as a modem or a network interface card to facilitate exchange of data with external computers via a network. The communication link between the system 500 and the network may be any type of network connection such as an Ethernet connection, a digital subscriber line (DSL), a telephone line, a cellular telephone system, a coaxial cable, etc.

Access to the input device(s) 545, the output device(s) 550, the mass storage device(s) 560 and/or the network is typically controlled by the I/O controller 540 in a conventional manner. In particular, the I/O controller 540 performs functions that enable the processor 525 to communicate with the input device(s) 545, the output device(s) 550, the mass storage device(s) 560 and/or the network via the bus 565 and the interface circuit 555.

While the components shown in FIG. 5 are depicted as separate blocks within the system 500, the functions performed by some of these blocks may be integrated within a single semiconductor circuit or may be implemented using two or more separate integrated circuits. For example, although the memory controller 530 and the I/O controller 540 are depicted as separate blocks within the chipset 535, one of ordinary skill in the relevant art will readily appreciate that the memory controller 530 and the I/O controller 540 may be integrated within a single semiconductor circuit.

Although examples of the embodiments of the disclosed subject matter are described, one of ordinary skill in the relevant art will readily appreciate that many other methods of implementing the disclosed subject matter may alternatively be used. For example, other circuits that allow a compensation current from a source to flow to the memory cell storage node 130 can also be used.

In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A Dynamic Random Access Memory (DRAM) cell comprising:
a leakage compensation circuit, wherein the leakage compensation circuit is to allow a compensation current from a source to flow to a memory cell storage node of the DRAM cell to compensate a leakage current from the memory cell storage node, wherein the DRAM cell has a pre-discharged write bit line to improve charge retention of the memory cell storage node in response to storing a logic zero in the memory cell storage node.

2. The DRAM cell of claim 1, wherein the leakage compensation circuit comprises:
a reverse biased junction coupled with the source and the memory cell storage node of the DRAM cell, wherein the reverse biased junction is formed using a P-diffusion in an N-well, and wherein there is a junction leakage current from the N-well to the memory cell storage node.

3. The DRAM cell of claim 1, wherein the leakage compensation circuit comprises:
an N-channel Metal Oxide Semiconductor field effect (NMOS) transistor coupled with the memory cell storage node of the DRAM cell, wherein a drain node of the NMOS transistor is coupled with the source, wherein a gate node and a source node of the NMOS transistor are coupled with the memory cell storage node, and wherein the NMOS transistor is to provide the compensation current.

4. The NMOS transistor of claim 3, wherein the compensation current is a sub-threshold leakage current from the source to the source node of the NMOS transistor.

5. The NMOS transistor of claim 3, wherein the compensation current is a gate tunneling leakage current from the source to the gate node of the NMOS transistor.

6. The NMOS transistor of claim 3, wherein the compensation current is a junction leakage current of the NMOS transistor.

7. The DRAM cell of claim 1, wherein the source is a power supply of the DRAM cell.

8. A Dynamic Random Access Memory (DRAM) module comprising:
a plurality of DRAM cells, wherein each of the plurality of DRAM cells comprises:
a leakage compensation circuit, wherein the leakage compensation circuit allows a compensation current from a source to flow to a memory cell storage node of each DRAM cell to compensate a leakage current from the memory cell storage node, wherein each DRAM cell has a pre-discharged write bit line to improve charge retention of the memory cell storage node in response to storing a logic zero in the memory cell storage node.

9. The DRAM module of claim 8, wherein the leakage compensation circuit comprises:
a reverse biased junction coupled with the source and the memory cell storage node, wherein the reverse biased junction is formed using a P-diffusion in an N-well, and wherein there is a junction leakage current from the N-well to the memory cell storage node.

10. The DRAM module of claim 8, wherein the leakage compensation circuit of at least one of the plurality of DRAM cells is shared with at least one uncompensated DRAM cell, wherein the at least one uncompensated DRAM cell does not have any leakage compensation circuit.

11. The DRAM module of claim 8, wherein the leakage compensation circuit in each DRAM cell comprises:
an N-channel Metal Oxide Semiconductor field effect (NMOS) transistor coupled with the memory cell storage node of each DRAM cell, wherein a drain node of the NMOS transistor is coupled with the source, wherein a gate node and a source node of the NMOS transistor are coupled with the memory cell storage node, and wherein the NMOS transistor is to provide the compensation current.

12. The NMOS transistor of claim 11, wherein the compensation current is a gate tunneling leakage current from the source to the gate node of the NMOS transistor.

13. The NMOS transistor of claim 11, wherein the compensation current is a junction leakage current of the NMOS transistor.

14. The DRAM module of claim 8, wherein the source in each DRAM cell is a power supply of the DRAM module.

15. The NMOS transistor of claim 11, wherein the compensation current is a sub-threshold leakage current from the source to the source node of the NMOS transistor.

16. A system comprising:
   a processor; and
   an embedded Dynamic Random Access Memory (DRAM) module coupled with the processor, to execute an instruction of the processor, wherein the embedded DRAM module comprises:
      a plurality of DRAM cells, wherein each of the plurality of DRAM cells comprises:
         a leakage compensation circuit, wherein the leakage compensation circuit allows a compensation current from a source to flow to a memory cell storage node of the DRAM cell to compensate a leakage current from the memory cell storage node, wherein each DRAM cell has a pre-discharged write bit line to improve the charge retention of the memory cell storage node in response to storing a logic zero in the memory cell storage node.

17. The embedded DRAM module of claim 16, wherein the leakage compensation circuit comprises:
   a reverse biased junction coupled with the source and the memory cell storage node, wherein the reverse biased junction is formed using a P-diffusion in an N-well, and wherein there is a junction leakage current from the N-well to the memory cell storage node.

18. The embedded DRAM module of claim 16, wherein the leakage compensation circuit of at least one of the plurality of DRAM cells is shared with at least one uncompensated DRAM cell, wherein the at least one uncompensated DRAM cell does not have any leakage compensation circuit.

19. The embedded DRAM module of claim 16, wherein the leakage compensation circuit in each DRAM cell comprises:
   an N-channel Metal Oxide Semiconductor field effect (NMOS) transistor coupled with the memory cell storage node, wherein a drain node of the NMOS transistor is coupled with the source, wherein a gate node and a source node of the NMOS transistor are coupled with the memory cell storage node, and wherein the NMOS transistor is to provide the compensation current.

20. The embedded DRAM module of claim 16, wherein the source in each of the plurality of DRAM cells is a power supply of the DRAM embedded module.

21. The NMOS transistor of claim 19, wherein the compensation current is a sub-threshold leakage current from the source to the source node of the NMOS transistor.

22. The NMOS transistor of claim 19, wherein the compensation current is a gate tunneling leakage current from the source to the gate node of the NMOS transistor.

23. The NMOS transistor of claim 19, wherein the compensation current is a junction leakage current of the NMOS transistor.

* * * * *